(12) United States Patent
Mawatari (10) Patent No.: US 9,705,070 B2
(45) Date of Patent: Jul. 11, 2017

(54) FERROELECTRIC THIN FILM, METHOD OF MANUFACTURING SAME AND METHOD OF MANUFACTURING PIEZOELECTRIC ELEMENT

(75) Inventor: Kenji Mawatari, Ibaraki (JP)

(73) Assignee: KONICA MINOLTA, INC., Tokyo (JP)

( * ) Notice: Subject to any disclaimer, the term of this patent is extended or adjusted under 35 U.S.C. 154(b) by 845 days.

(21) Appl. No.: 13/884,869

(22) PCT Filed: Oct. 26, 2011

(86) PCT No.: PCT/JP2011/074611
§ 371 (c)(1),
(2), (4) Date: May 10, 2013

(87) PCT Pub. No.: WO2012/063642
PCT Pub. Date: May 18, 2012

(65) Prior Publication Data
US 2013/0228454 A1 Sep. 5, 2013

(30) Foreign Application Priority Data

Nov. 10, 2010 (JP) ................................. 2010-251455

(51) Int. Cl.
*H01L 41/187* (2006.01)
*H01L 41/316* (2013.01)
(Continued)

(52) U.S. Cl.
CPC ........ *H01L 41/1876* (2013.01); *C04B 35/491* (2013.01); *C23C 14/088* (2013.01);
(Continued)

(58) Field of Classification Search
CPC . H01J 37/3447; H01J 37/3429; C23C 14/088; C23C 14/024; C23C 14/027; C23C 14/3492; C23C 14/548
See application file for complete search history.

(56) References Cited

U.S. PATENT DOCUMENTS 5,482,604 A * 1/1996 Ahonen ................ C23C 14/505
204/298.11
5,502,345 A * 3/1996 Kahn .................. H01L 41/0926
310/328
(Continued)

FOREIGN PATENT DOCUMENTS

| CH | EP 1271658 A1 * | 1/2003 | ......... H01L 27/0805 |
| JP | 06-290983 | 10/1994 | |

(Continued)

OTHER PUBLICATIONS

G.H. Heartling, "Ferroelectric Ceramics: History and Technology", Journal of American Ceramic Society, vol. 82, No. 4, pp. 797-818, 1999.

*Primary Examiner* — David Sample
(74) *Attorney, Agent, or Firm* — Cozen O'Connor (57) ABSTRACT

In order to obtain a ferroelectric thin film that is formed to have a predetermined thickness on a substrate, that have satisfactory crystallization and that achieves a high piezoelectric property, a method of manufacturing such a ferroelectric thin film and a method of manufacturing a piezoelectric element having such a ferroelectric thin film, when a dielectric material of a perovskite structure is formed into a film on the substrate, a predetermined amount of additive is mixed with PZT, and the concentration of the additive mixed is varied in the thickness direction of the thin film.

5 Claims, 6 Drawing Sheets

(51) Int. Cl.
  *G01J 5/34* (2006.01)
  *H03H 3/00* (2006.01)
  *C23C 14/08* (2006.01)
  *C23C 14/35* (2006.01)
  *C04B 35/491* (2006.01)
  *H03H 3/02* (2006.01)
  *H03H 9/02* (2006.01)
  *H01L 41/08* (2006.01)
  *B41J 2/16* (2006.01)

(52) U.S. Cl.
  CPC .............. *C23C 14/35* (2013.01); *G01J 5/34* (2013.01); *H01L 41/0805* (2013.01); *H01L 41/316* (2013.01); *H03H 3/00* (2013.01); *H03H 3/02* (2013.01); *H03H 9/02031* (2013.01); *B41J 2/1646* (2013.01); *C04B 2235/3213* (2013.01); *C04B 2235/3224* (2013.01); *C04B 2235/3227* (2013.01); *C04B 2235/3251* (2013.01); *C04B 2235/3258* (2013.01); *C04B 2235/3294* (2013.01); *C04B 2235/3298* (2013.01); *C04B 2235/768* (2013.01); *Y10T 428/265* (2015.01)

(56) References Cited

U.S. PATENT DOCUMENTS

| | | | | |
|---|---|---|---|---|
| 5,736,759 | A | * | 4/1998 | Haushalter .............. H01L 28/56 257/295 |
| 6,111,284 | A | * | 8/2000 | Sakurai ................. C23C 16/401 257/295 |
| 7,148,530 | B2 | * | 12/2006 | Shin ........................ H01L 28/56 257/295 |
| 2002/0094372 | A1 | * | 7/2002 | Qiu ..................... C23C 18/1216 427/100 |
| 2003/0038023 | A1 | * | 2/2003 | Ramberg ............. C23C 14/3442 204/192.2 |
| 2006/0230590 | A1 | | 10/2006 | Kuriki et al. |
| 2009/0020797 | A1 | * | 1/2009 | Wang .................... H01L 27/105 257/295 |

FOREIGN PATENT DOCUMENTS

| | | |
|---|---|---|
| JP | 10-287468 | 10/1998 |
| JP | 2000-208828 | 7/2000 |
| JP | 2006-306709 | 11/2006 |
| JP | 2008-147682 | 6/2008 |
| JP | 2008-270514 | 11/2008 |

* cited by examiner

FIG.1

- L6(Au,0.2μm) ⎫ D2
- L5(Ti,0.02μm) ⎭
- L4(PLZT,5μm)
- L3(Pt,0.1μm) ⎫ D1
- L2(Ti,0.02μm) ⎭
- L1(SiO₂,0.1μm)
- B1(Si,400~700μm)

ABO₃ PEROVSKITE STRUCTURE

PIEZOELECTRIC PROPERTY OF PLZT

| Composition | Density (g/cm³) | Tc (°C) | K | tan δ (%) | Kp | K33 | d33 (×10⁻¹² C/N) | d31 (×10⁻¹² C/N) |
|---|---|---|---|---|---|---|---|---|
| BaTiO₃ | 5.7 | 115 | 1700 | 0.5 | 0.36 | 0.5 | 190 | -78 |
| PZT-4 | 7.5 | 328 | 1300 | 0.4 | 0.58 | 0.7 | 289 | -123 |
| PZT-5A | 7.8 | 365 | 1700 | 2.0 | 0.6 | 0.71 | 374 | -171 |
| PZT-5H | 7.5 | 193 | 3400 | 4.0 | 0.65 | 0.75 | 593 | -274 |
| PMN-PT(65/35) | 7.6 | 185 | 3640 |  | 0.58 | 0.70 | 563 | -241 |
| PMN-PT(90/10) | 7.6 | 40 | 24000 | 5.5 | 0 | 0 | 0 | 0 |
| PbNb₂O₆ | 6.0 | 570 | 225 | 1.0 | 0.07 | 0.38 | 85 | -9 |
| (Na₀.₅K₀.₅)NbO₃ | 4.5 | 420 | 496 | 1.4 | 0.46 | 0.61 | 127 | -51 |
| PLZT 7/60/40 | 7.8 | 160 | 2590 | 1.9 | 0.72 |  | 710 | -262 |
| PLZT 8/40/60 | 7.7 | 245 | 980 | 1.2 | 0.34 |  |  |  |
| PLZT 12/40/60 | 7.7 | 145 | 1300 | 1.3 | 0.47 |  | 235 |  |
| PLZT 7/65/35 | 7.8 | 150 | 1850 | 1.8 | 0.62 |  | 400 |  |
| PLZT 8/65/35 | 7.8 | 110 | 3400 | 3.0 | 0.65 |  | 682 |  |
| PLZT 9/65/35 | 7.8 | 80 | 5700 | 6.0 | 0 | 0 | 0 | 0 |
| PLZT 9.5/65/35 | 7.8 | 75 | 5500 | 5.5 | 0 | 0 | 0 | 0 |
| PLZT 7.6/70/30 | 7.8 | 100 | 4940 | 5.4 | 0.65 |  |  |  |
| PLZT 8/70/30 | 7.8 | 85 | 5100 | 4.7 | 0 | 0 | 0 | 0 |

REFERENCE DOCUMENT: Gene H. Heartling "Ferroelectric Ceramics: History and Technology", Journal of American Ceramic Society, 82[4]797-818(1999), Table III

FERROELECTRIC THIN FILM, METHOD OF MANUFACTURING SAME AND METHOD OF MANUFACTURING PIEZOELECTRIC ELEMENT

RELATED APPLICATIONS

This is a U.S. national stage of International application No. PCT/JP2011/074611 filed on Oct. 26, 2011.

This patent application claims the priority of Japanese application no. 2010-251455 filed Nov. 10, 2010, the disclosure content of which is hereby incorporated by reference.

TECHNICAL FIELD

The present invention relates to a ferroelectric thin film and a method of manufacturing a piezoelectric element having such a ferroelectric thin film, and more particularly to a ferroelectric thin film formed in a layer on a substrate, a method of manufacturing such a ferroelectric thin film and a method of manufacturing a piezoelectric element having such a ferroelectric thin film.

BACKGROUND ART

Conventionally, as electrical mechanical conversion elements such as a drive element and a sensor, piezoelectrics such as PZT (lead zirconate titanate) are used. In recent years, in order to meet requirements for reducing the size of devices, densely packing the devices and reducing the cost of the devices, MEMS (micro electro mechanical system) elements using Si substrates have been increasing. In order to apply a piezoelectric to a MEMS element, it is preferable to reduce the thickness of its film.

By reducing the thickness of the film, it is possible to perform highly accurate processing using a semiconductor process technology such as film formation and photolithography, with the result that it is possible to realize size reduction and dense packing. Moreover, since it is possible to perform simultaneous processing on a large-area wafer, it is possible to reduce the cost. Furthermore, the efficiency of conversion of the mechanical into the electrical is enhanced, and the property of a drive element, the sensitivity of a sensor and the like are advantageously enhanced.

As a method of forming a film of a piezoelectric such as PZT on a substrate of Si (silicon) or the like, chemical methods such as a CVD method, physical methods such as a sputtering method and an ion plating method and liquid-phase growth methods such as a sol-gel method are known. PZT formed into the film performs a satisfactory piezoelectric effect when its crystal has a perovskite structure.

A PZT film formed on the electrode of the Si substrate is a polycrystal where a plurality of crystals gather in the shape of a column because the lattice constants of the crystals of the electrode differ from each other. It is known that, in the columnar crystals described above, the more crystals grow in the film thickness direction on the same crystal plane (the more the orientation is increased), the more the piezoelectric property of the film is enhanced.

In recent years, it has been required to further enhance the property of a piezoelectric film such as PZT. One way to enhance the piezoelectric property as described above is to enhance a relative permittivity and the piezoelectric property by adding an impurity. It is known that in particular, in a piezoelectric having a perovskite structure (which ideally has a cubic unit lattice, which is a crystal structure formed with a metal A arranged in each vertex of the cubical crystal, a metal B arranged in a body center and an oxygen atom O arranged in each face center of the cubical crystal and which includes a tetragonal crystal, an orthorhombic crystal and a rhombohedral crystal where the cubical crystal is distorted), a substance called PLZT obtained by substituting La (lanthanum) which is an element that is one valence larger than Pb arranged in an A site has a high relative permittivity and a high piezoelectric constant.

For example, non-patent document 1 discloses that, in PLZT of a bulk ceramic, it is possible to obtain a high piezoelectric property with a predetermined amount of La added (for example, 8%).

However, when a thin film of PLZT is obtained by film formation, since crystallization is poor as compared with PZT, in the thin film, a high property obtained in bulk is not obtained Hence, patent document 1 discloses a technology for forming a PLT layer free from Zr on a substrate and forming a PLZT layer on the PLT layer. In this technology, the PLT layer having satisfactory crystallization is used as an undercoated layer, and thus it is possible to enhance the crystallization of PLZT.

RELATED ART DOCUMENT

Patent Document

Patent document 1: JP-A-6-290983

Non-Patent Document

Non-patent document 1: Gene H. Heartling "Ferroelectric Ceramics: History and Technology", Journal of American Ceramic Society, 82[4]797-818(1999)

DISCLOSURE OF THE INVENTION

Problems to be Solved by the Invention

However, in the configuration disclosed in patent document 1, PLT that is the undercoated layer originally has a low piezoelectric property, and thus it is not appropriate for enhancing the piezoelectric property of the piezoelectric film as a whole.

The present invention is made in view of the foregoing problem; an object of the present invention is to provide a ferroelectric thin film that achieves a high piezoelectric property, a method of manufacturing such a ferroelectric thin film and a method of manufacturing a piezoelectric element having such a ferroelectric thin film.

Means for Solving the Problem

To achieve the above object, according to the present invention, there is provided a ferroelectric thin film obtained by forming a dielectric material of a perovskite structure into a film on a base member, where the dielectric material is formed with a composite oxide in which an additive of a metallic material other than Pb, Zr and Ti is mixed with PZT, and a concentration of the additive is substantially zero in the vicinity of the base member and is varied in the thickness direction of the thin film.

In this configuration, whether or not the crystallization is satisfactory is varied by the concentration of the additive, and, even when the dielectric material changes its piezoelectric property, the concentration of the additive that has satisfactory crystallization and the concentration of the additive that has a high piezoelectric property are combined, and thus it is possible to obtain a ferroelectric thin film that achieves a predetermined piezoelectric property and that is formed to have a predetermined thickness without the crystallization being degraded.

According to the present invention, there is provided a method of manufacturing a ferroelectric thin film obtained by forming a dielectric material of a perovskite structure into a film on a base member, the method including: a piezoelectric-film film formation step of using, as the dielectric material, a composite oxide in which an additive of a metallic material other than Pb, Zr and Ti is mixed with PZT and forming the film such that a concentration of the additive is substantially zero in the vicinity of the base member and is varied in the thickness direction of the thin film.

In this configuration, the film formation is performed by combining the concentration of the additive that has satisfactory crystallization and the concentration of the additive that has a high piezoelectric property, and thus it is possible to perform the film formation such that a predetermined piezoelectric property is achieved and a predetermined thickness is provided without the crystallization being degraded, with the result that it is possible to obtain the method of manufacturing the ferroelectric thin film that is formed to have the predetermined thickness on the substrate and that achieves the high piezoelectric property.

According to the present invention, there is provided a method of manufacturing a piezoelectric element, the method including: a protective film formation step of forming a thermally oxidized film on a silicon substrate; a lower electrode formation step of forming a lower electrode layer into a film on the thermally oxidized film formed; a piezoelectric-film film formation step that is a step of forming a piezoelectric film of a perovskite structure on the lower electrode layer formed into the film, that uses, as a material of the piezoelectric film, a composite oxide in which an additive of a metallic material other than Pb, Zr and Ti is mixed with PZT and that forms the film such that a concentration of the additive is substantially zero in the vicinity of the lower electrode layer and is varied in the thickness direction of the thin film; and an upper electrode formation step of forming an upper electrode layer into a film on the formed piezoelectric film.

In this configuration, the piezoelectric film formed by combining the concentration of the additive that has satisfactory crystallization and the concentration of the additive that has a high piezoelectric property is provided, and thus it is possible to manufacture a piezoelectric element that can achieve a predetermined piezoelectric property.

Advantages of the Invention

According to the present invention, it is possible to obtain a ferroelectric thin film that achieves a high piezoelectric property and a method of manufacturing it. It is also possible to manufacture a piezoelectric element that has such a ferroelectric thin film and achieves the high piezoelectric property.

DESCRIPTION OF EMBODIMENTS

Embodiments of the present invention will be described below with reference to accompanying drawings. Like constituent members are identified with like symbols, and their detail description will be omitted as necessary.

Figure 1:
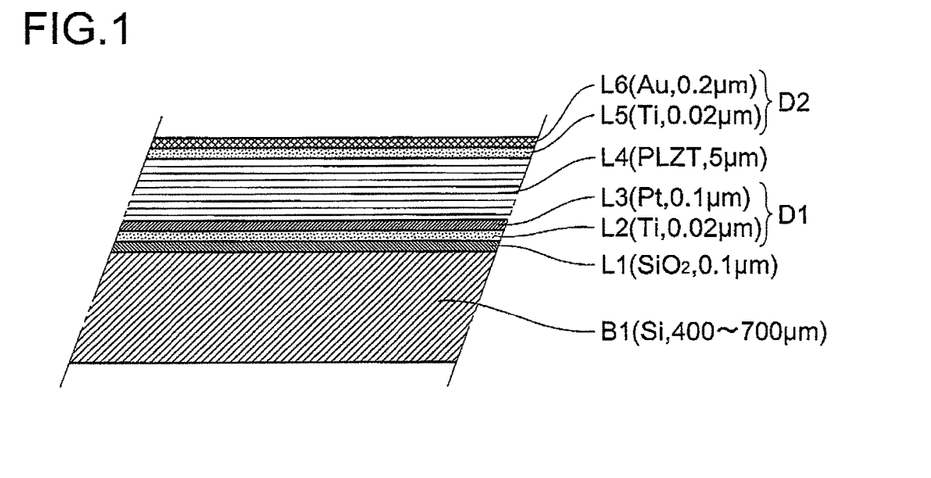
FIG. 1 A cross-sectional view showing the layer structure of a piezoelectric element having a ferroelectric thin film of the present invention.

The ferroelectric thin film of the present embodiment will be described with reference to FIG. 1. FIG. 1 is a cross-sectional schematic view showing the layer configuration of a piezoelectric element having the ferroelectric thin film (dielectric film L4); in the layer configuration, a silicon substrate B1 is used as a substrate, and on the substrate, a thermally oxidized film ($SiO_2$ layer) L1, a Ti film L2, a Pt film L3, the dielectric film L4, a Ti film L5 and an Au film L6 are sequentially formed.

The thickness of the substrate B1 is, for example, about 400 to 700 μm though it differs depending on the substrate size (diameter). The thermally oxidized film L1 is formed so as to protect and insulate the substrate B1, and is formed by heating the substrate B1 under an atmosphere of oxygen at about 1200° C., and its thickness is, for example, about 0.1 μm.

The Ti film L2 and the Pt film L3 are sequentially formed on the thermally oxidized film L1 by a sputtering method, and both of them form a lower electrode layer D1. Ti is used for enhancing the adhesion of $SiO_2$ and Pt.; its film thickness is, for example, about 0.02 μm. The thickness of Pt is, for example, about 0.1 μm. As the material of the lower electrode layer D1, instead of Pt, for example, Ir may be used.

The dielectric film L4 is formed of for example, PZT or PLZT, and is formed on the lower electrode layer D1 by a sputtering method; although its thickness differs according to the application, preferably, the thickness is 1 μm or less for, for example, a sensor and a filter and is about 3 to 5 μm for an actuator. Hence, in the present embodiment where it is used as a drive element for a MEMS actuator, the thickness is set at 5 μm. The details of a method of forming the dielectric film L4 will be described later.

Then, on the dielectric film L4, the Ti film L5 and the Au film L6 are sequentially formed by a sputtering method, and thus an upper electrode layer D2 is formed. Ti is used for enhancing the adhesion of PZT or PLZT and the Au; its film thickness is, for example, about 0.02 μm. The thickness of Au is, for example, about 0.1 μm.

Figure 2:
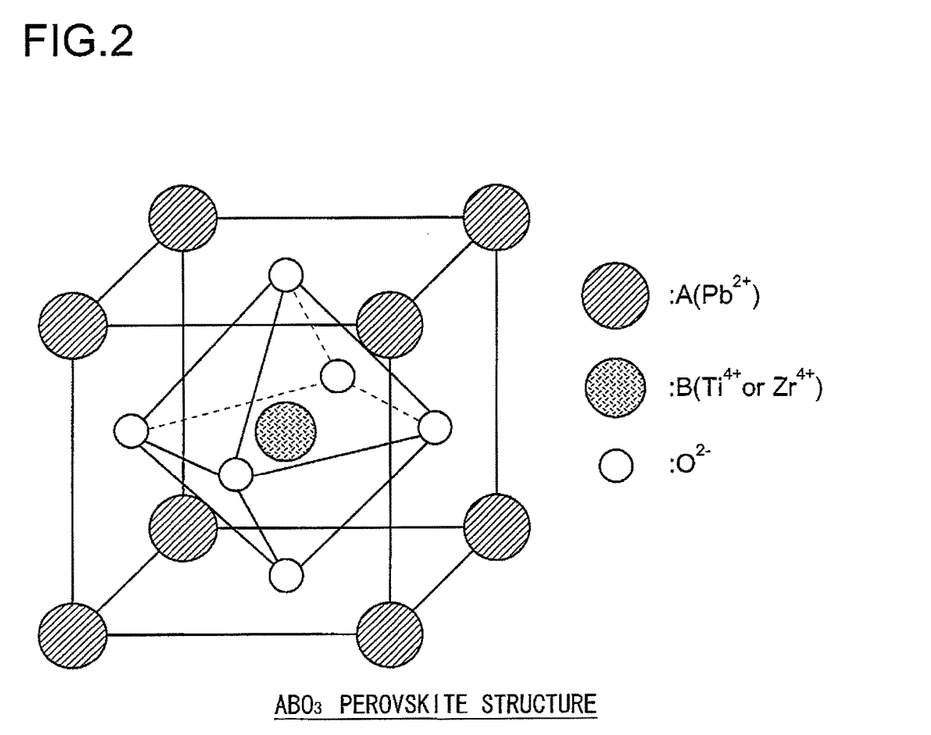
FIG. 2 An illustrative diagram schematically showing the crystal structure of a ferroelectric.

The dielectric film L4 has a perovskite structure shown in FIG. 2, and is formed with a composite oxide of multiple elements such as PZT or PLZT; in the present embodiment, a dielectric material obtained by mixing a predetermined amount of La (lanthanum) with PZT is used to form a film.

The perovskite structure ideally has a cubic unit lattice shown in the figure. The perovskite structure also has a ternary system crystal structure called $ABO_3$ that is formed with a metal A (for example, Pb) arranged in each vertex of the cubical crystal, a metal B (for example, Ti or Zr) arranged in a body center and an oxygen atom O arranged in each face center of the cubical crystal and includes a tetragonal crystal, an orthorhombic crystal and a rhombohedral crystal where the cubical crystal is distorted. Here, a substance called PLZT obtained by substituting La (lanthanum) which is an element that is one valence larger than Pb arranged in an A site has a high relative permittivity and a high piezoelectric constant.

Since, as described above, an additive (metallic material) of a predetermined concentration other than Pb, Zr and Ti of PZT is mixed with PZT used as a piezoelectric to achieve a high piezoelectric property, in the present embodiment, a ferroelectric thin film is used in which a dielectric material formed with a composite oxide of multiple elements where La is mixed with PZT is formed into a film on a base member (obtained by forming the lower electrode layer D1 on the substrate B1). The concentration of the additive is varied in the direction of thickness of the thin film.

This is because, as the concentration of the additive added to PZT is decreased, the crystallization is more satisfactory, and the perovskite structure is maintained. Hence, by forming the film while changing the amount of additive added in the direction of thickness of the film, it is possible to form the ferroelectric thin film of a high piezoelectric property without decreasing the crystallization.

It is known that, when a film is formed on the undercoated layer, if the crystallization of the undercoated layer is satisfactory, the crystallization of the film formed thereon is enhanced. Hence, the undercoated layer on which the ferroelectric thin film where the additive of a predetermined concentration is mixed is formed is preferably a layer that has satisfactory crystallization.

Figure 3:
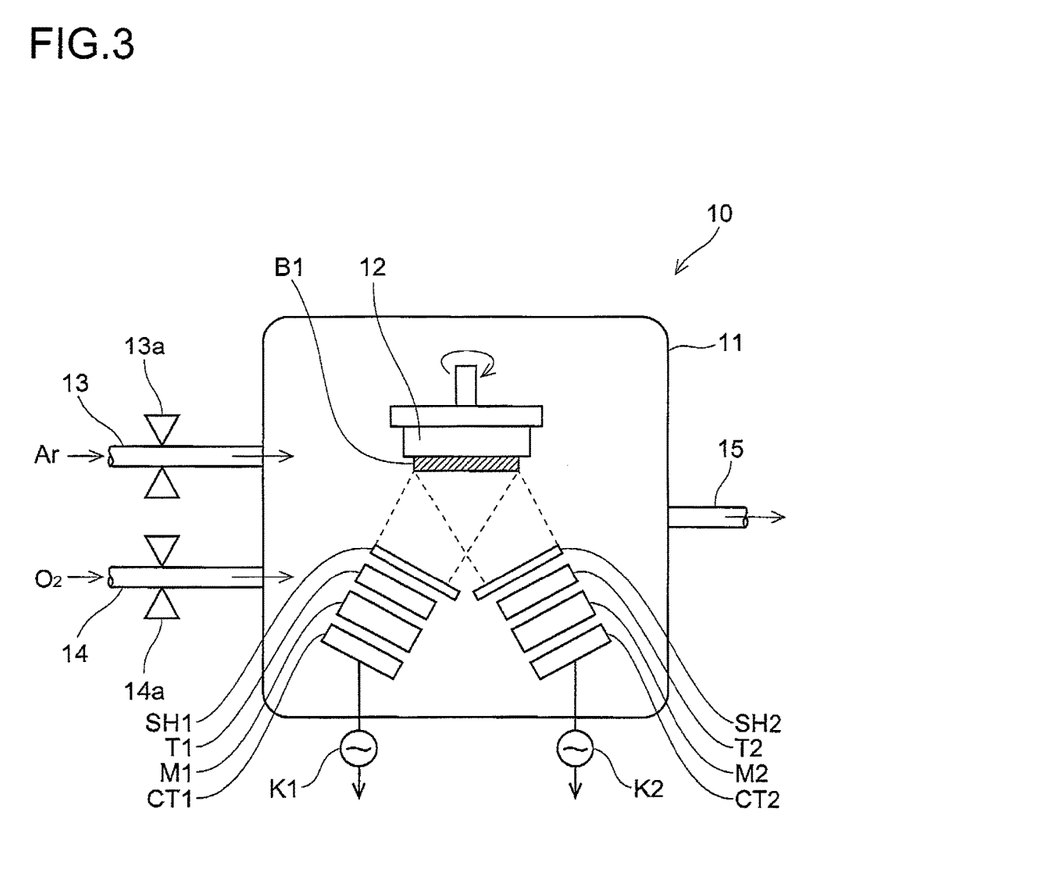
FIG. 3 A schematic illustrative diagram showing the configuration of a film formation device.

A film formation device that forms the dielectric film L4 of the present embodiment will now be described with reference to FIG. 3. The film formation device 10 of the present embodiment is a film formation device of a sputtering system in which, on the substrate B1 (for example, a silicon substrate) placed within the film formation device, a layer of a predetermined material is formed into a film by a high-frequency magnetron sputtering method.

The film formation device 10 includes: a substrate heating heater 12 that heats the substrate B1 placed within a vacuum chamber 11; an introduction tube 13 that introduces argon (Ar) that is a sputtering gas; an introduction tube 14 that introduces oxygen; and an exhaust tube 15. T1 represents a target of lanthanum oxide ($La_2O_3$), and T2 represents a target of PZT. M1 and M2 represent magnets, CT1 and CT2 represent cathode electrodes and K1 and K2 represent high-frequency power supplies.

The target T1 is produced by burning, grinding and filling the powder of the lanthanum oxide ($La_2O_3$) in a target dish and pressurizing it with a press. The target T2 is produced by mixing, burning, grinding and filling the powder of a PZT material prepared to have a predetermined composition ratio in a target dish and pressurizing it with a press.

Then, the targets T1 and T2 are respectively placed on the magnets M1 and M2. A cover may be placed thereon. The magnets M1 and M2 and the cathode electrodes CT1 and CT2 thereunder are insulated with an insulator from the vacuum chamber 11. The cathode electrodes CT1 and CT2 are connected to the high-frequency power supplies K1 and K2.

Then, the substrate B1 is placed on the substrate heating heater 12. Thereafter, the vacuum chamber 11 is exhausted, and the substrate B1 is heated with the substrate heating heater 12 up to 600° C. After the heating, valves 13a and 14a are opened, Ar and $O_2$ in predetermined proportions, which are sputtering gases, are introduced into the vacuum chamber 11 through the introduction tube and the degree of vacuum is kept at a predetermined value. A high-frequency power is fed by the high-frequency power supplies K1 and K2 to the targets T1 and T2, and thus plasma is produced. Here, since a film formation rate can be adjusted according to the setting value of the high-frequency power, it is possible to adjust, by adjusting the high-frequency power on the side of lanthanum oxide, the concentration of La within a PLZT film, that is, the concentration of La mixed. By independently opening and closing shutters SH1 and SH2, it is possible to form films of lanthanum oxide and PZT on the substrate as necessary.

Example 1

Figure 4:
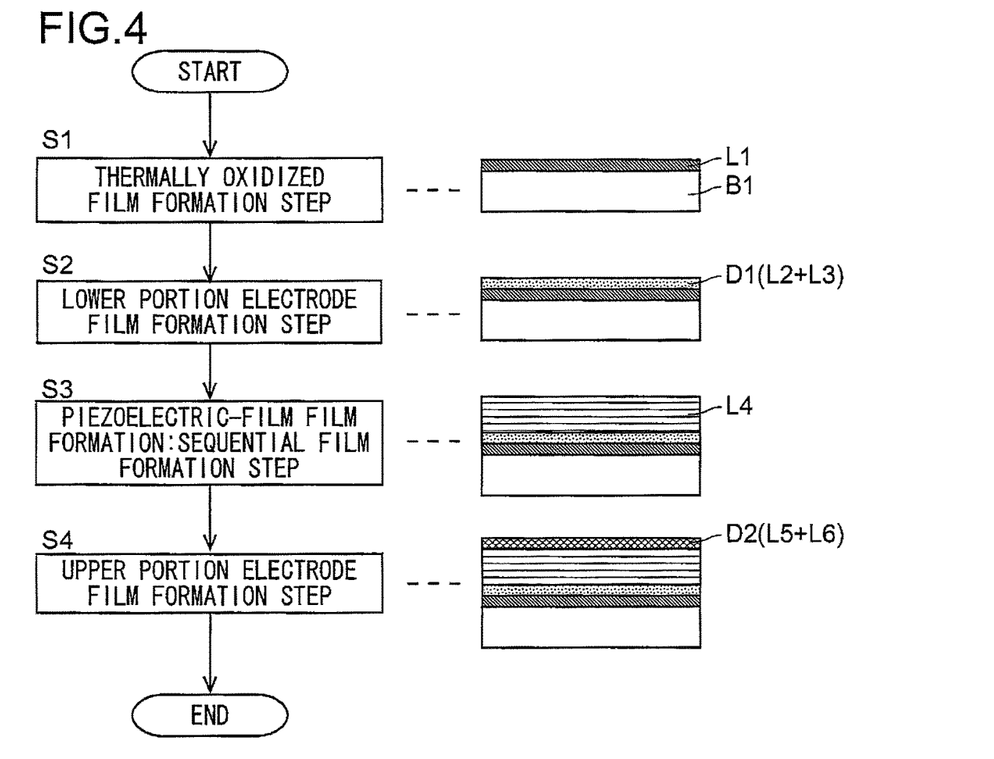
FIG. 4 An illustrative diagram showing a film formation flow having a sequential film formation step together with a cross-sectional view of each manufacturing step.

The film formation flow of example 1 is shown in FIG. 4. In example 1, the substrate is a silicon substrate, the additive is La and a PLZT thin film that is a composite oxide obtained by adding La to PZT is formed. The concentration of La mixed is gradually increased from substantially zero to a predetermined concentration in the direction of thickness of the thin film.

In other words, a piezoelectric-film film formation step included in example 1 is a sequential film formation step, and this film formation flow is a first film formation flow showing a method of manufacturing a piezoelectric element that has, as a ferroelectric thin film, the PLZT thin film obtained by adding La to PZT.

As shown in FIG. 4, when the film formation step of example 1 is started, a thermally oxidized film formation step S1 of forming the thermally oxidized film on the silicon substrate is first performed, then a lower electrode film formation step S2 of forming the lower electrode layer D1 on the thermally oxidized film L1 is performed and then a piezoelectric-film film formation step S3 (sequential film formation step) of forming the piezoelectric film (ferroelectric thin film) while gradually increasing the concentration of La mixed is performed. After the formation of the piezoelectric film having a predetermined thickness, an upper electrode film formation step S4 of forming the upper electrode layer D2 into a film is performed.

In the concentration of La mixed, a predetermined concentration is set at an upper limit concentration. Since the predetermined concentration preferably falls within a range that can achieve a high piezoelectric property of PLZT, in the present embodiment, the predetermined concentration is set at 8%. In other words, the concentration of La mixed in example 1 is continuously increased from 0 to 8% (that is, a range of 0 to 8%) in the direction of thickness of the thin film. In this configuration, since the concentration of La added and mixed is substantially zero in the initial stage of the layer formation, the crystallization is satisfactory, and, since the concentration of La mixed is gradually increased to an upper limit concentration of 8% that achieves a high piezoelectric property, a predetermined piezoelectric property is achieved, with the result that it is possible to obtain a ferroelectric thin film which is formed to have a predetermined thickness without the crystallization being degraded.

Figure 9:
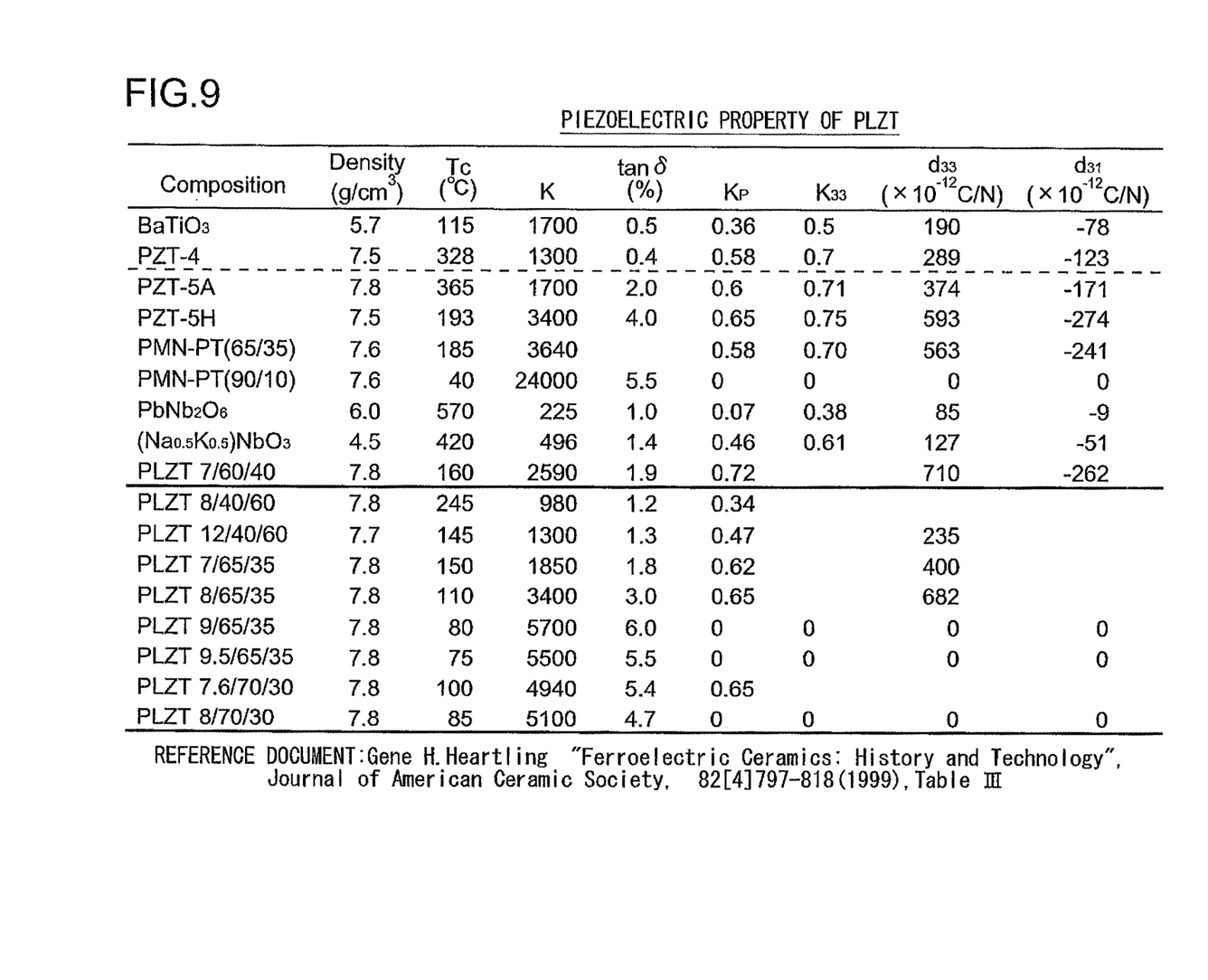
FIG. 9 A table showing the piezoelectric property of PLZT.

The reason why the predetermined concentration is set at 8% is that, as described in a piezoelectric property (whose main portion is shown in FIG. 9) shown in Table III of the above-mentioned non-patent document 1 "Gene H. Heartling "Ferroelectric Ceramics: History and Technology", Journal of American Ceramic Society, 82[4]797-818(1999)", the piezoelectric distortion constant ($d_{33}$) of PLZT8/65/35 with a mixing concentration being 8% is $682 \times 10^{-12}$ C/N, and the ($d_{33}$) of PLZT9/65/35 with the mixing concentration being 9% is 0 C/N, and thus the predetermined concentration is an appropriated value as the upper limit concentration.

The thickness of the silicon substrate B1 is generally 400 to 700 µm though it differs depending on the substrate size. The thermally oxidized film L1 is formed so as to perform protection and insulation, the silicone substrate is heated and formed under an atmosphere of oxygen at about 1200° C. and its thickness is generally about 0.1 µm. The lower electrode is formed into a film by performing a sputtering method on Ti and Pt. Ti is used for enhancing the adhesion of $SiO_2$ and Pt, and its film thickness is about 0.02 µm. The thickness of Pt is generally about 0.1 µm.

Then, on the lower electrode, that is, on the base member where the lower electrode layer is formed on the substrate B1, the piezoelectric film is formed by a sputtering method. The power of the target of PZT is first turned on, a desired high-frequency power is set to start the film formation of PZT and a piezoelectric film having satisfactory crystallization is formed. At the same time when the film formation of PZT is started, the high-frequency power supply on the side of the target of lanthanum oxide is turned on, power is gradually increased and the amount of La taken in the film is gradually increased. In this way, the PLZT film in which the amount of La added into the PLZT film is continuously varied (increased) is formed. Then, the Ti layer and the Au layer that are to be the upper electrode layer D2 are formed into a film, and a piezoelectric element that achieves a predetermined piezoelectric property is produced.

Figure 5:
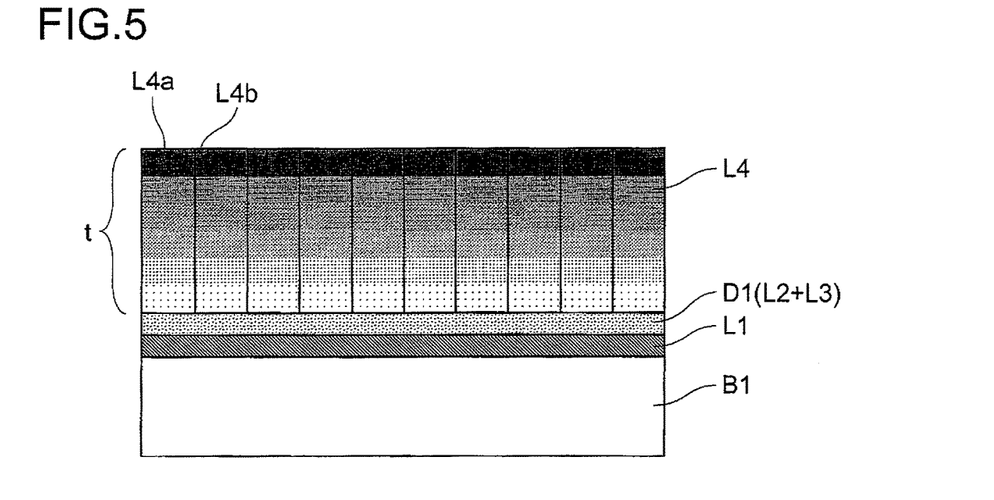
FIG. 5 A cross-sectional view showing the crystal state of a piezoelectric film obtained by the film formation flow of FIG. 4.

The layer configuration of the piezoelectric film (ferroelectric thin film) obtained in the above film formation step will be described with reference to FIG. 5. As shown in the figure, the piezoelectric film (the dielectric film L4: the ferroelectric thin film) formed on the lower electrode layer D1 formed into a film on the substrate B1 is a polycrystal where a plurality of crystal grains L4a gather in the shape of a column, and has a structure where small columnar crystals extending vertically from the substrate and having satisfactory orientation gather. Between the adjacent crystal grains L4a, a crystal grain boundary L4b is formed.

As indicated in concentration shown in the direction of thickness of the film, the dielectric film L4 is formed with the PLZT film in which the concentration of La mixed is continuously increased. In this case, since the concentration of La in the vicinity of the film surface is preferably the upper limit concentration indicating a high piezoelectric property, in the present embodiment, it is set at 8%. It becomes clear that, in this configuration, a PZT initial layer in the vicinity of the lower electrode has substantially the same composition ratio as that of the target, and that since a perovskite single phase is a film having satisfactory crystallization, the PLZT film where the concentration of La is continuously increased thereon maintains the initial satisfactory crystallization, and it is possible to obtain a piezoelectric film (ferroelectric thin film) having satisfactory crystallization even if the thickness t is 5 µm.

According to the method of manufacturing the piezoelectric element described above, films are stacked in layers sequentially from a film of a lower additive concentration having satisfactory crystallization to a piezoelectric film that achieves a predetermined piezoelectric property while the concentration is being gradually increased, and thus it is possible to produce a piezoelectric element having a ferroelectric thin film which is formed to have a predetermined thickness without the crystallization being degraded.

Example 2

Figure 6:
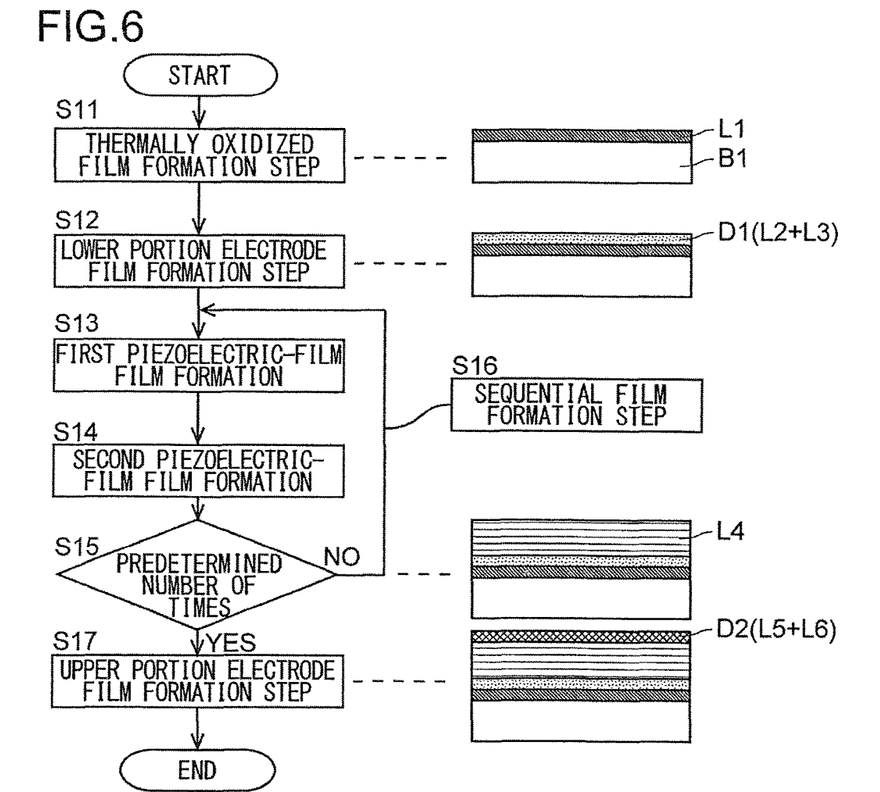
FIG. 6 An illustrative diagram showing a film formation flow having a repeated film formation step together with a cross-sectional view of each manufacturing step.

The film formation flow of example 2 is shown in FIG. 6. In example 2, the substrate is a silicon substrate, the additive is La and a PLZT thin film that is a composite oxide obtained by adding La to PZT is formed. In the concentration of La mixed, a layer in which the concentration is substantially zero and a layer in which the concentration is a predetermined concentration (for example, 8%) are sequentially stacked such that each of the layers has a predetermined thickness.

In other words, a piezoelectric-film film formation step included in example 2 is a repeated film formation step, and this film formation flow is a second film formation flow showing the method of manufacturing the piezoelectric element that has, as the ferroelectric thin film, the PLZT thin film obtained by adding La to PZT.

As shown in FIG. 6, when the film formation step of example 2 is started, a thermally oxidized film formation step S11 of forming the thermally oxidized film on the silicon substrate is first performed, then a lower electrode film formation step S12 of forming the lower electrode layer D1 on the thermally oxidized film L1 is performed and then a piezoelectric-film film formation step (repeated film formation step S16) of forming the piezoelectric film by sequentially and repeatedly stacking a layer in which the concentration of La mixed is zero and a layer in which the concentration is a predetermined concentration is performed. After the formation of the piezoelectric film having a predetermined thickness, an upper electrode film formation step S17 of forming the upper electrode layer D2 into a film is performed.

As described above, the piezoelectric-film film formation step adopted in example 2 is the repeated film formation step S16 that includes the first piezoelectric-film film formation step S13 of forming the film of the layer in which the concentration of La mixed is zero and the second piezoelectric-film film formation step S14 of forming the film of the layer in which the concentration is the predetermined concentration. By increasing or decreasing the number of times of the repetition, it is possible to adjust the thickness of the piezoelectric film to be formed. In a number-of-times-of-repetition detection step S15 of detecting a predetermined number of times of repetition, the films are formed by repeating the film formation the predetermined number of times, and thereafter the upper electrode film formation step S17 is performed.

Since the concentration of La mixed is preferably a concentration that achieves a high piezoelectric property of PLZT, in the present embodiment, this predetermined concentration is set at 8%. In other words, in the concentration of La mixed in example 2, the layer in which the concentration is zero and the layer in which the concentration is 8% are repeatedly sequentially stacked in the direction of thickness of the thin film. In this configuration, the layer in which the concentration of La added and mixed is significantly low and its crystallization is satisfactory and the layer in which a high piezoelectric property is achieved and the concentration is 8% are sequentially repeatedly formed into a film, and thus it is possible to form a thin film stack member as a whole that achieves a predetermined piezoelectric property, with the result that it is possible to obtain a ferroelectric thin film which is formed to have a predetermined thickness without the crystallization being degraded.

Likewise, even in example 2, the thermally oxidized film L1 is formed on the substrate B1 to have a thickness of 0.1 µm, and the lower electrode layer D1 composed of the Ti layer having a film thickness of 0.02 µm and the Pt layer having a film thickness of 0.1 µm is formed into a film. Then, on the lower electrode layer D1, that is, on the base member where the lower electrode layer D1 is formed on the substrate B1, the piezoelectric film is formed by a sputtering method.

The high-frequency power is individually set such that, when the power of the target of PZT and the power of the target of lanthanum oxide are turned on and both the shutters are opened, PLZT where 8% of La is added is provided. Thereafter, only the shutter on the side of the PZT target is opened, the film formation of PZT is started and a piezoelectric having satisfactory crystallization is formed into a film to have a thickness of about 200 nm (0.2 µm). When the film thickness of PZT reaches about 200 nm, the shutter on the side of the target of lanthanum oxide is also opened, and PLZT where the amount of addition is 8% is formed into a film to have about a thickness of about 800 nm.

Thereafter, the shutter on the side of the target of lanthanum oxide is temporarily closed, only PZT is again formed into a film to have a thickness of about 200 nm and, thereon, PLZT where the amount of addition is 8% is again formed into a film to have a thickness of about 800 nm. Thereafter, this is repeated, and thus a piezoelectric film (ferroelectric thin film) is produced in which the thin PZT layer and the PLZT layer where 8% of La is added are alternately stacked and whose thickness t is about 5 µm. Then, the Ti layer and the Au layer that are to be an upper electrode are formed into a film, and a piezoelectric element that achieves a predetermined piezoelectric property is produced. The dielectric film L4 will be described below as the piezoelectric film L4.

The layer structure of the piezoelectric film L4 obtained in the film formation step discussed above will be described with reference to FIG. 7. As shown in the figure, the piezoelectric film L4 formed on the substrate B1 is a polycrystal where a plurality of crystals gather in the shape of a column, and has a structure where small cylindrical crystals extending vertically from the substrate and having satisfactory orientation gather.

Figure 7:
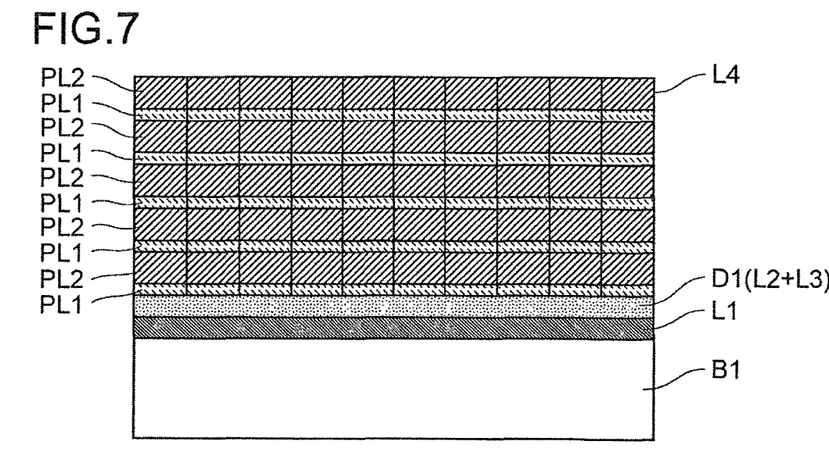
FIG. 7 A cross-sectional view showing the crystal state of a piezoelectric film obtained by the film formation flow of FIG. 6.

The piezoelectric film L4 also has a configuration in which a first piezoelectric film PL1 where the concentration of La mixed is almost zero and a second piezoelectric film PL2 having a predetermined concentration are alternately stacked in layers in the direction of thickness of the film. In this configuration, it is possible to obtain again the effect of the undercoated layer by the PZT layer having satisfactory crystallization before the film thickness of PLZT is increased to decrease the crystallization of the film, and, even if the amount of La added is intermittently varied, a piezoelectric film (ferroelectric thin film) having satisfactory orientation and crystallization of the PLZT film.

Hence, in the method of manufacturing the piezoelectric element described above, a piezoelectric film in which a film of a concentration achieving a predetermined piezoelectric property is formed to have a predetermined thickness is repeatedly stacked on a film in which satisfactory crystallization is achieved and the concentration is low, and thus it is possible to produce a piezoelectric element having a ferroelectric thin film formed to have a predetermined thickness without the crystallization being degraded.

<Application Example of Piezoelectric Device>

Figure 8A:
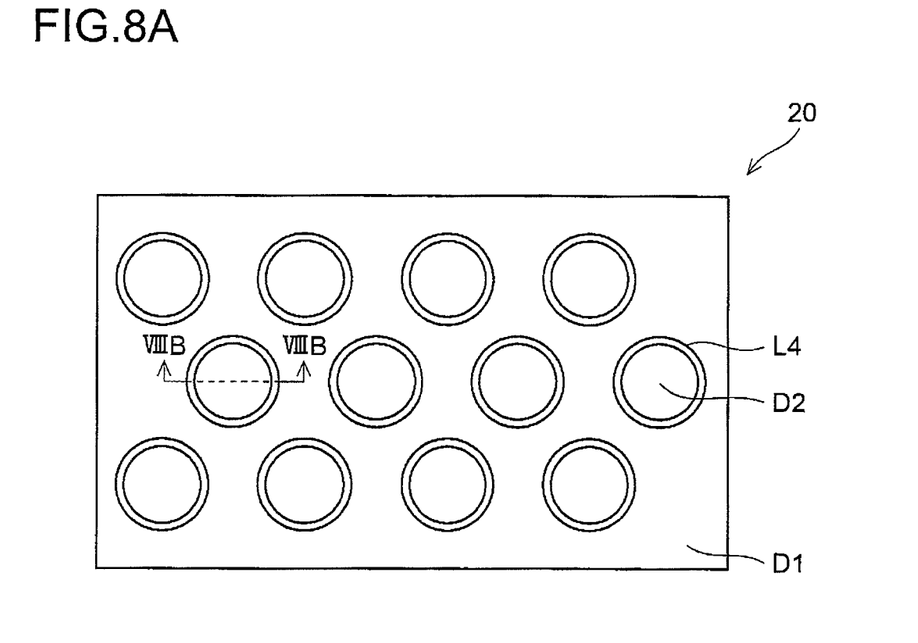
FIG. 8A A plan view showing a configuration when the piezoelectric is applied to a diaphragm.
Figure 8B:
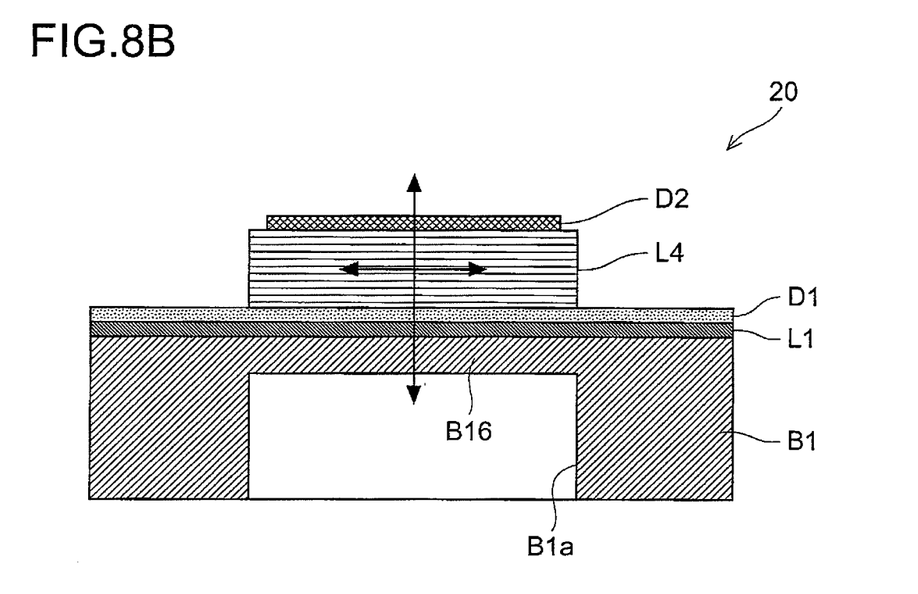
FIG. 8B A cross-sectional view taken along line VIIIB-VIIIB and seen in a direction indicated by the arrows of FIG. 8A.

FIG. 8A is a plan view showing a configuration in which a piezoelectric device 20 having the piezoelectric element produced in the present embodiment is applied to a diaphragm (vibration plate); FIG. 8B is a cross-sectional view taken along line VIIIB and seen in a direction indicated by the arrows of FIG. 8A. The piezoelectric films LA are arranged in necessary regions of the substrate B1 in a two-dimensional staggered configuration. A region corresponding to the formation region of the piezoelectric film L4 in the substrate B1 is a concave portion B1a whose part in the direction of thickness is removed and in which its cross section is circular; in an upper portion (on the side of the bottom portion of the concave portion B1a) on the concave portion B1a in the substrate B1, a thin plate-shaped region B1b is left. The lower electrode layer D1 and the upper electrode layer D2 are connected to an external control circuit with unillustrated wiring.

An electrical signal is applied from the control circuit to the lower electrode layer D1 and the upper electrode layer D2 sandwiching a predetermined piezoelectric film L4, and thus it is possible to drive only the predetermined piezoelectric film L4. Specifically, a predetermined electric field is applied to the upper and lower electrodes of the dielectric film L4, and thus the piezoelectric film L4 expands and contracts in a left/right direction, and the piezoelectric film L4 and the region B1b of the substrate B1 are curved in an up/down direction by a bimetallic effect. Hence, the concave portion B1a of the substrate B1 is filled with gas or liquid, and thus it is possible to use the piezoelectric device 20 as a pump.

By detecting the amount of charge in the predetermined piezoelectric film L4 through the lower electrode layer D1 and the upper electrode layer D2, it is also possible to detect the amount of deformation of the piezoelectric film LA. Specifically, since when the piezoelectric film L4 is vibrated by sound waves or ultrasound sound waves, an electric field is generated between the upper and lower electrodes by the opposite effect to what has been described above, the magnitude of the electric field or the frequency of a detection signal is detected, and thus it is also possible to use the piezoelectric device 20 as a sensor.

Other Embodiments

Although PLZT using La as the additive has been described, the present invention is not limited to La, and another additive that can achieve the piezoelectric property can be used. For example, in the A site, at least one type of metallic material selected from a group consisting of lanthanoides such as Nd, Sr and Bi can be used. In the B site, at least one type of metallic material selected from a group consisting of Nb, Ta, W and Sb can be used. Additives may be contained both in the A site and in the B site.

Specifically, the additive substitutes for the A site in the perovskite structure of an $ABO_3$ configuration, and is at least one type of metallic ion selected from a group consisting of lanthanoides including La and Nd, Sr and Bi. In this configuration, a predetermined additive substitutes for part of Pb arranged in the A site of PZT, and thus it is possible to obtain a ferroelectric thin film that achieves a predetermined piezoelectric property.

The additive described above substitutes for the B site in the perovskite structure of the $ABO_3$ configuration, and is at least one type of metallic ion selected from the group consisting of Nb, Ta, W and Sb. In this configuration, a predetermined additive substitutes for part of Zr or Ti arranged in the B site of PZT, and thus it is possible to obtain a ferroelectric thin film that achieves a predetermined piezoelectric property.

As described above, in the ferroelectric thin film of the present invention, the concentration of an additive (metallic material) mixed with a dielectric material of the perovskite structure is varied in the direction of thickness of the film formation, and the concentration of the additive that has satisfactory crystallization and the concentration of the additive that has a high piezoelectric property are combined, and thus it is possible to obtain a ferroelectric thin film that achieves a predetermined piezoelectric property and that is formed to have a predetermined thickness without the crystallization being degraded.

Hence, it is possible to form a thick film for an actuator having a thickness of about 3 to 5 µm with satisfactory crystallization, with the result that it is possible to obtain a ferroelectric thin film which can be used as a drive element for a MEMS actuator.

With the method of manufacturing the ferroelectric thin film according to the present invention, it is possible to obtain: a ferroelectric thin film that is formed to have a predetermined thickness on a substrate with satisfactory crystallization and that achieves a high piezoelectric property; and a method of manufacturing such a ferroelectric thin film.

With the method of manufacturing the piezoelectric element according to the present invention, it is possible to manufacture a piezoelectric element having a ferroelectric thin film that is formed to have a predetermined thickness and that achieves a piezoelectric property.

INDUSTRIAL APPLICABILITY

The present invention can be utilized for various devices such as an inkjet head, an ultrasonic sensor, an infrared sensor and a frequency filter; in particular, the present invention can be utilized for devices required to have a small size and a small thickness.

LIST OF REFERENCE SYMBOLS

B1 substrate (silicon substrate)
L1 thermally oxidized film
D1 lower electrode layer
D2 upper electrode layer
L4 dielectric film (ferroelectric thin film: piezoelectric film)
S3 sequential film formation step
S16 repeated film formation step
10 film formation device

The invention claimed is:

1. A ferroelectric thin film element comprising:
a base member; and
a ferroelectric thin film formed on the base member, the thin film being formed of a dielectric material of a perovskite structure,
wherein the dielectric material is a composite oxide in which an additive of a metallic material other than Pb, Zr and Ti is mixed with PZT, and a concentration of the additive is substantially zero in the vicinity of the base member and is varied in the thickness direction of the thin film, and
wherein the thin film includes a first layer in which the concentration of the additive is substantially zero and a second layer in which the concentration of the additive is a predetermined concentration and the first and second layers are alternately repeated in the thickness direction of the thin film.

2. The ferroelectric thin film element according to claim 1,
wherein the additive substitutes for an A site in the perovskite structure of an $ABO_3$ configuration, and is at least one type of metallic ion selected from a group consisting of lanthanoides including La and Nd, Sr and Bi.

3. The ferroelectric thin film element according to claim 1,
wherein the additive substitutes for a B site in the perovskite structure of the $ABO_3$ configuration, and is at least one type of metallic ion selected from a group consisting of Nb, Ta, W and Sb.

4. The ferroelectric thin film element according to claim 1,
wherein the additive is La, and the concentration of La in the first layer is substantially zero and the concentration of La in the second layer is 8%.

5. The ferroelectric thin film element according to claim 1,
wherein the entire thickness of the thin film is 3 to 5 µm.

* * * * *